United States Patent
Margalit

(10) Patent No.: US 8,941,137 B2
(45) Date of Patent: *Jan. 27, 2015

(54) LIGHT EMITTING DIODE PACKAGE AND METHOD OF MANUFACTURE

(76) Inventor: Mordehai Margalit, Zichron Yaaqov (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/413,407

(22) Filed: Mar. 6, 2012

(65) Prior Publication Data

US 2012/0286311 A1 Nov. 15, 2012

Related U.S. Application Data

(60) Provisional application No. 61/449,685, filed on Mar. 6, 2011, provisional application No. 61/449,686, filed on Mar. 6, 2011.

(51) Int. Cl.
*H01L 33/00* (2010.01)
*H01L 21/00* (2006.01)
*H01L 33/52* (2010.01)
*H01L 33/58* (2010.01)
*H01L 33/50* (2010.01)
*H01L 33/60* (2010.01)

(52) U.S. Cl.
CPC ............. *H01L 33/52* (2013.01); *H01L 33/58* (2013.01); *H01L 33/50* (2013.01); *H01L 33/60* (2013.01); *H01L 2933/005* (2013.01)
USPC .......... 257/98; 257/99; 257/E33.067; 438/26; 438/27; 438/29

(58) Field of Classification Search
USPC ........ 257/88, 98, 99, 100, 676, 778; 438/458, 438/455, 492, 22, 123, 27, 28, 29; 362/311, 362/351
See application file for complete search history.

(56) References Cited

U.S. PATENT DOCUMENTS

| | | | |
|---|---|---|---|
| 6,501,091 B1 | 12/2002 | Bawendi et al. | |
| 7,232,754 B2 | 6/2007 | Kirby et al. | |
| 7,910,940 B2 | 3/2011 | Koike et al. | |
| 7,951,625 B2 | 5/2011 | Kamei | |
| 8,278,213 B2 | 10/2012 | Kameyama et al. | |
| 2003/0006418 A1* | 1/2003 | Emerson et al. | 257/79 |
| 2005/0017258 A1* | 1/2005 | Fehrer et al. | 257/98 |
| 2006/0006404 A1* | 1/2006 | Ibbetson et al. | 257/99 |
| 2006/0011935 A1* | 1/2006 | Krames et al. | 257/99 |
| 2006/0073692 A1 | 4/2006 | Yoshida et al. | |
| 2006/0081869 A1* | 4/2006 | Lu et al. | 257/99 |
| 2006/0284321 A1 | 12/2006 | Wu et al. | |

(Continued)

FOREIGN PATENT DOCUMENTS

WO 2011033516 A1 3/2011

*Primary Examiner* — Mary Wilczewski
*Assistant Examiner* — Erik T Peterson
(74) *Attorney, Agent, or Firm* — Intrinsic Law Corp.; Ibrahim M. Hallaj

(57) ABSTRACT

A light emitting diode (LED) device and packaging for same is disclosed. In some aspects, the LED is manufactured using a vertical configuration including a plurality of layers. Certain layers act to promote mechanical, electrical, thermal, or optical characteristics of the device. The device avoids design problems, including manufacturing complexities, costs and heat dissipation problems found in conventional LED devices. Some embodiments include a plurality of optically permissive layers, including an optically permissive cover substrate or wafer stacked over a semiconductor LED and positioned using one or more alignment markers.

11 Claims, 18 Drawing Sheets

(56) References Cited

U.S. PATENT DOCUMENTS

| | | | |
|---|---|---|---|
| 2007/0166851 A1* | 7/2007 | Tran et al. | 438/22 |
| 2008/0068845 A1* | 3/2008 | Aida et al. | 362/311 |
| 2009/0108283 A1 | 4/2009 | Kadotani et al. | |
| 2009/0173958 A1* | 7/2009 | Chakraborty et al. | 257/98 |
| 2009/0267096 A1* | 10/2009 | Kim | 257/98 |
| 2009/0273002 A1* | 11/2009 | Chiou et al. | 257/99 |
| 2009/0283787 A1* | 11/2009 | Donofrio et al. | 257/98 |
| 2009/0291518 A1 | 11/2009 | Kim et al. | |
| 2009/0315054 A1* | 12/2009 | Kim et al. | 257/98 |
| 2010/0053929 A1* | 3/2010 | Bisberg | 362/84 |
| 2010/0148193 A1* | 6/2010 | Duong et al. | 257/88 |
| 2010/0207145 A1 | 8/2010 | Yoo | |
| 2011/0006322 A1* | 1/2011 | Li et al. | 257/98 |

\* cited by examiner

US 8,941,137 B2

LIGHT EMITTING DIODE PACKAGE AND METHOD OF MANUFACTURE

RELATED APPLICATIONS

This application is related to and claims the benefit and priority of U.S. Provisional Application Nos. 61/449,685 and 61/449,686, both filed on Mar. 6, 2011, which are hereby incorporated by reference.

TECHNICAL FIELD

The present application is directed to a light emitting diode (LED) device implemented on a wafer cover layer and provided with features permitting efficient and repeatable manufacture of the same.

BACKGROUND

A light emitting diode (LED) is a semiconductor device that is configured to receive electrical power or stimulation and to output electromagnetic radiation, commonly in the visible range of the spectrum (light). Portions of a LED comprise doped semiconductor materials that operate to combine charge in a way that releases said light energy from the body of the LED material. The output energy or light is determined by the band gap of the semiconductor materials and operating conditions of the LED.

Light emitting diodes (LEDs) compare favorably to other sources of light and are especially useful in certain applications and markets. For example, LED lighting generally provides advantages with respect to energy efficiency, compact, rugged, long-lasting design and form factor, as well as other features. LED lighting compares favorably with other sources in the amount of light energy generated in the visible electromagnetic spectrum compared to the infra-red or heat energy wasted by the light source. In addition, LED lights include fewer environmentally damaging components when compared to other light forms, and therefore provide better compliance with restrictions on hazardous substances (RohS) regulations.

That said, conventional LED devices can be relatively costly to manufacture by some metrics when compared to other light sources. One reason for this is the exacting packaging requirements for manufacturing LEDs. LED packaging calls for proper clean conditions, micro-fabrication facilities similar to other semiconductor manufacturing operations, sealing requirements, optical requirements, the use of phosphor in LED applications, as well as packaging that is designed to handle the conduction of heat generated in the devices.

Conventional LED packaging includes silicon (Si) or Ceramic based carrier substrates. The LEDs can be mounted on the carrier, or alternatively the many LEDs can be mounted on a wafer of the carrier and the LEDs are singulated at the end of the packaging process. The wafer based approach is termed wafer level assembly packaging (WLP). However, these conventional techniques require the use of a carrier substrate to support the LED, which can double the cost of making and packaging the LED device. In addition, the carrier substrate greatly increases the thermal resistivity of the device and adversely affects its heat removal characteristics.

Accordingly, there is a need for LED devices that do not suffer from some or all of the above problems.

SUMMARY

A light emitting diode (LED) device and packaging for same is disclosed. In some aspects, the LED is manufactured by epitaxial growth or other chemical or physical deposition techniques of a plurality of layers. Certain layers act to promote mechanical, electrical, thermal, or optical characteristics of the device. The device avoids design problems, including manufacturing complexities, costs and heat dissipation problems found in conventional LED devices. Some embodiments include a plurality of optically permissive layers, including an optically permissive cover substrate or wafer stacked over a semiconductor LED and positioned using one or more alignment markers.

Some embodiments are directed to a light emitting device, comprising a semiconductor LED including doped and intrinsic regions thereof; a conducting carrier layer disposed proximal to a first surface of said semiconductor LED and separated therefrom by a metallic interface; an optically permissive layer proximal to a second surface of said semiconductor LED, said first and second surfaces of said semiconductor LED being on opposing faces thereof; an optically definable material proximal to or within said optically permissive layer that affects an optical characteristic of emitted light passing therethrough; and an optically permissive cover substrate covering at least a portion of the above components.

Other embodiments are directed to ways of making such a light emitting device or a group of devices on a wafer in a manufacturing context. Specifically, embodiments are directed to a method for making a light emitting device, the method comprising forming a plurality of doped layers in a light emitting device (LED) disposed on conductive carrier layer; forming a recess in said conductive carrier layer and said LED so as to allow electrical contact with a first doped layer of said LED at a depth of said first doped layer in said LED; providing electrical contact to a second doped layer of said LED proximal to said conductive layer so as to bias the LED using a bias voltage applied between said first and second doped layers of the LED; and securing the LED to an optically permissive cover substrate using an optically permissive layer including an optically definable material through which light generated by said LED can pass.

BRIEF DESCRIPTION OF THE DRAWINGS

For a fuller understanding of the nature and advantages of the present concepts, reference is made to the following detailed description of preferred embodiments and in connection with the accompanying drawings, in which.

DETAILED DESCRIPTION

Modern LED devices are based on semiconducting materials and their properties. For example, some LEDs are made using gallium nitride (GaN) which is a type of bandgap semiconductor suited for use in high power LEDs. GaN LEDs are typically epitaxially grown on a sapphire substrate. These LEDs comprise a P-I-N junction device having an intrinsic (I) layer disposed between a N-type doped layer and a P-type doped layer. The device is driven using suitable electrical driving signals by way of electrodes or contacts coupled to the N and the P type portions of the LED. Electronic activity causes the emission of visible electromagnetic radiation (light) from the intrinsic portion of the device according to the electromotive force applied thereto and configuration of the device.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments below, those skilled in the art would appreciate that the present disclosure can be applied to making and packaging power integrated circuit (IC) components, radio frequency (RF) components, micro electro-mechanical systems (MEMS), or other discrete components.

Figure 1:
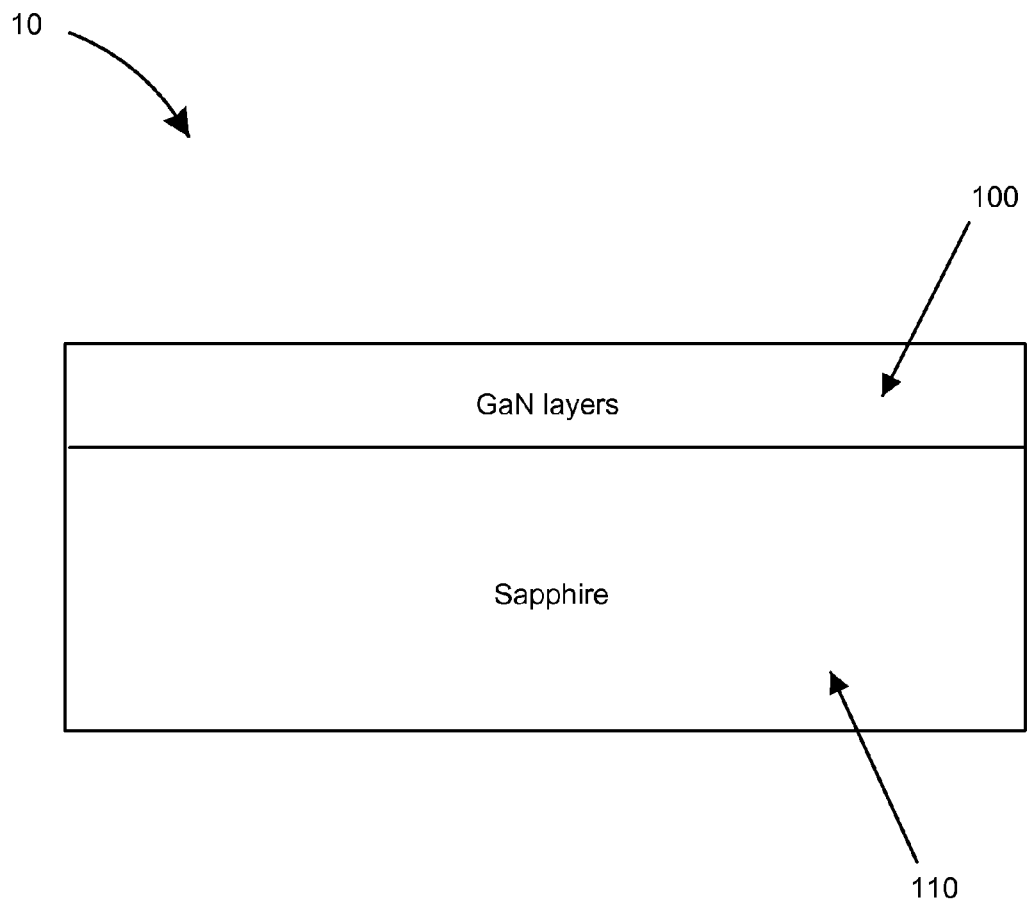
FIG. 1 illustrates a semiconducting LED layer above a sapphire layer according to the prior art.

FIG. 1 illustrates a light emitting device or LED device, 10 such as those described above, having a GaN layer 100, which is a semiconductor LED, disposed on a sapphire layer 110. The device of FIG. 1 is usually processed using some semiconductor micro fabrication techniques. In some examples, portions of the LED (GaN layer) are etched away or removed using techniques known to those skilled in the art. Other applications of conducting and non-conducting layers are applied to such a base design, along with channels and vias for various functionality as will be described below.

Figure 2:
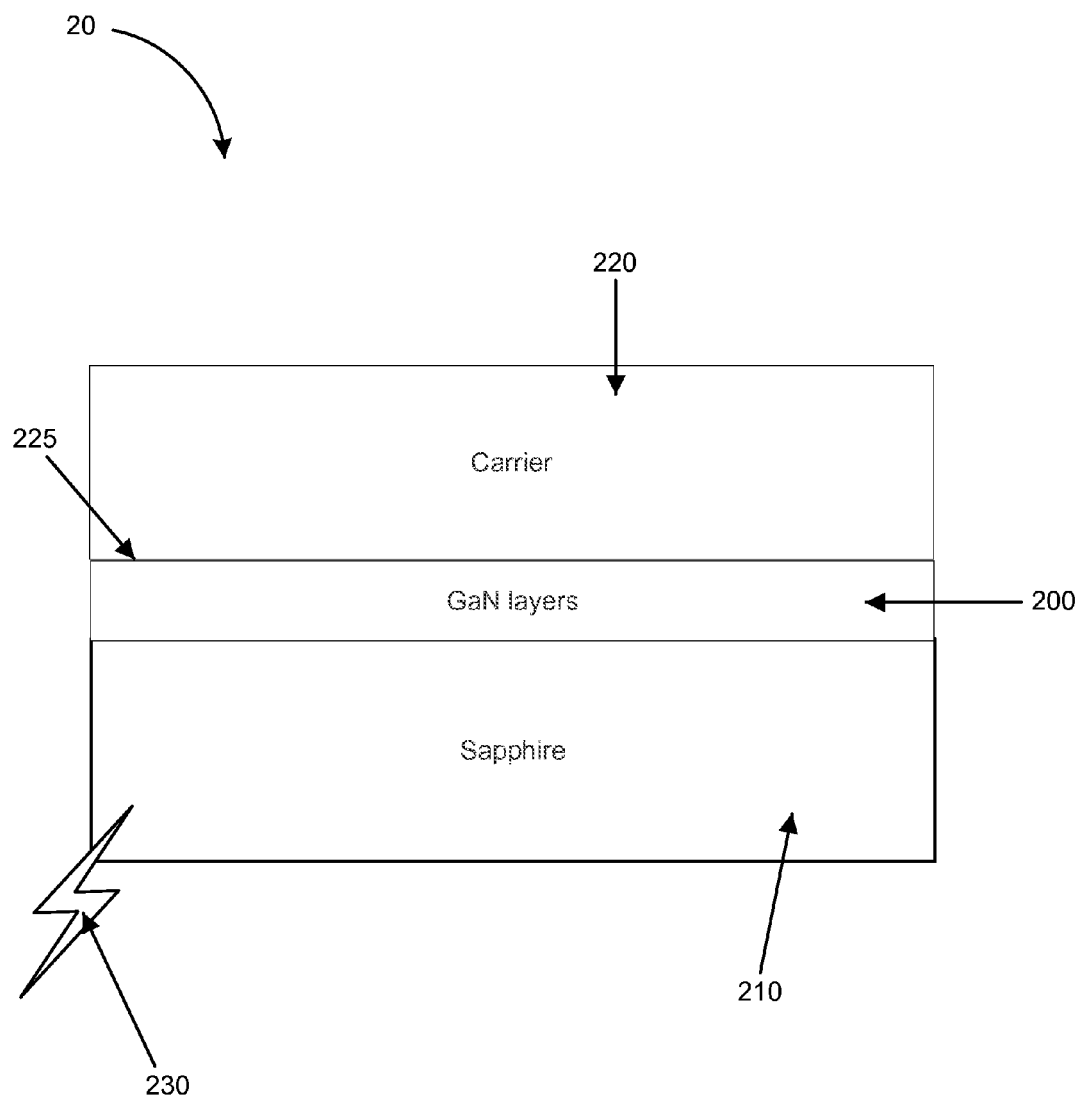
FIG. 2 illustrates an exemplary light emitting device or LED formed by laser liftoff according to the prior art.

FIG. 2 illustrates an exemplary light emitting device or LED 20 including a semiconductor (e.g., GaN) layer 200 disposed on a sapphire, or Silicon wafer 210. The LED layer 200 is further coupled on one side to a thermally and electrically conductive carrier layer 220, which may be Copper or Silicon. A metallic interface 225 separates but provides an interface for GaN layer 200 and carrier layer 220. In another embodiment, the LED layers are grown on a Silicon Carbide wafer, the Silicon Carbide wafer is electrically conductive and optically transparent. Hence it does not need to be removed and may be maintained. The electrically conductive aspect of it will be addressed in the specific description.

Figure 3:
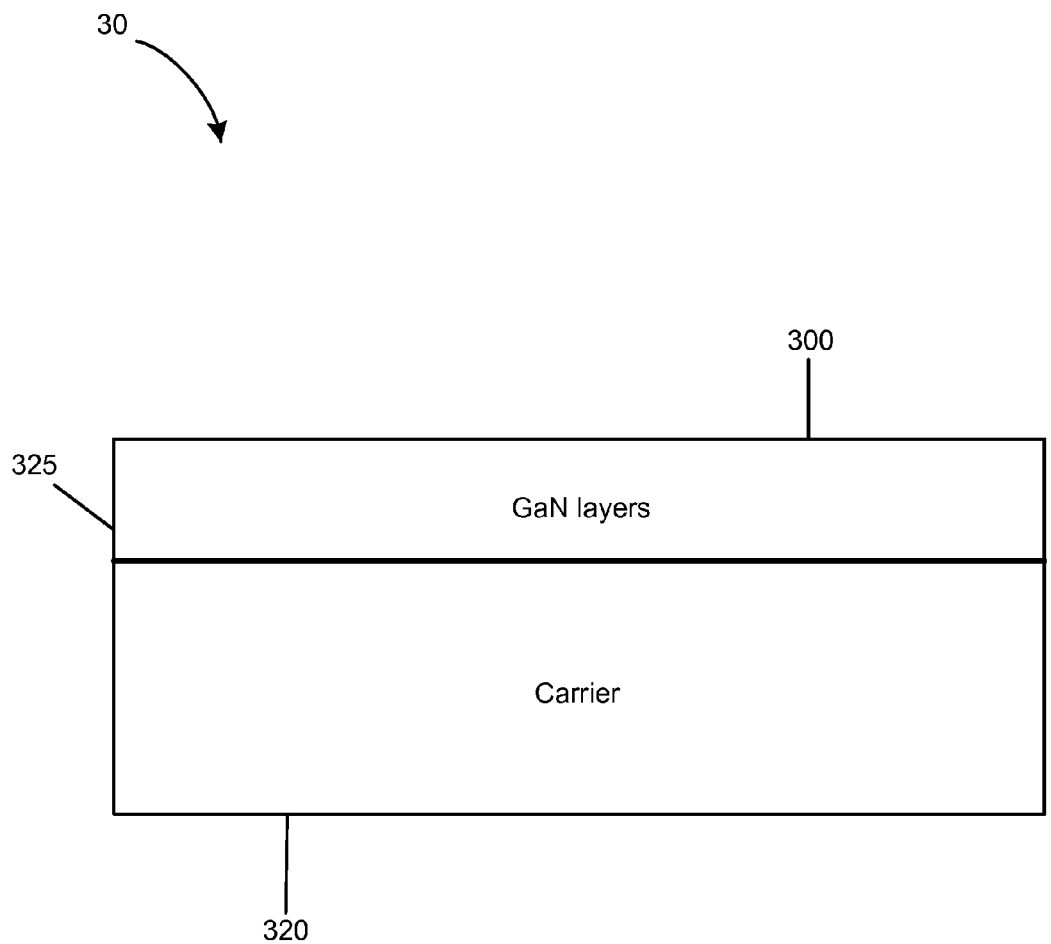
FIG. 3 illustrates an exemplary light emitting device resulting from the laser liftoff according to the prior art.

Laser liftoff is applied (represented by 230) to cause separation of LED GaN layer 200 from underlying sapphire layer 210. The resulting structure after the step of laser liftoff is shown in FIG. 3. In the case of a Silicon Carbide wafer there is no need for the laser lift off and the structure contains the Silicon Carbide wafer. In the case of Silicon, an alternative option to laser lift off is the chemical etching of the Silicon wafer.

FIG. 3 illustrates a light emitting device 30 comprising a semiconductor LED layer 300, a metallic interface 325 and a Copper or Silicon (or similar) carrier layer 320.

Figure 4:
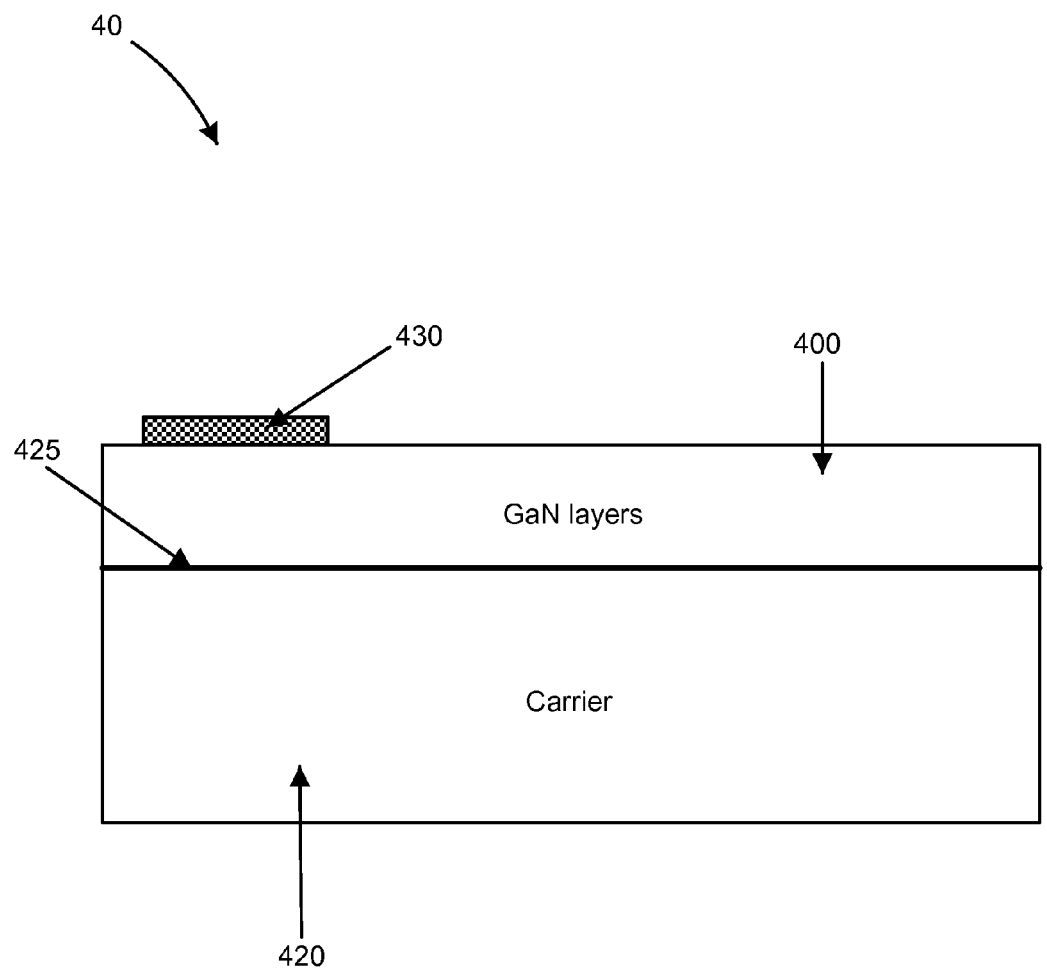
FIG. 4 illustrates a device having a metal pad deposited on a portion of the GaN layers of the device.

FIG. 4 illustrates a device similar to that of FIG. 3 with a metal pad 430 deposited on a portion of the GaN layers 400 of the device. In an embodiment, the GaN layer comprises a P-I-N junction having strata therein including a P-type doped layer, a N-type doped layer and an intrinsic (I) semiconductor layer in the middle between the P and N type layers. In operation, electrons flowing from the N type layer, recombine with holes flowing from the P-type layer in the intrinsic layer. The recombination results in the emission of a photon with a wavelength corresponding to the band gap of the semiconductor.

Figure 5:
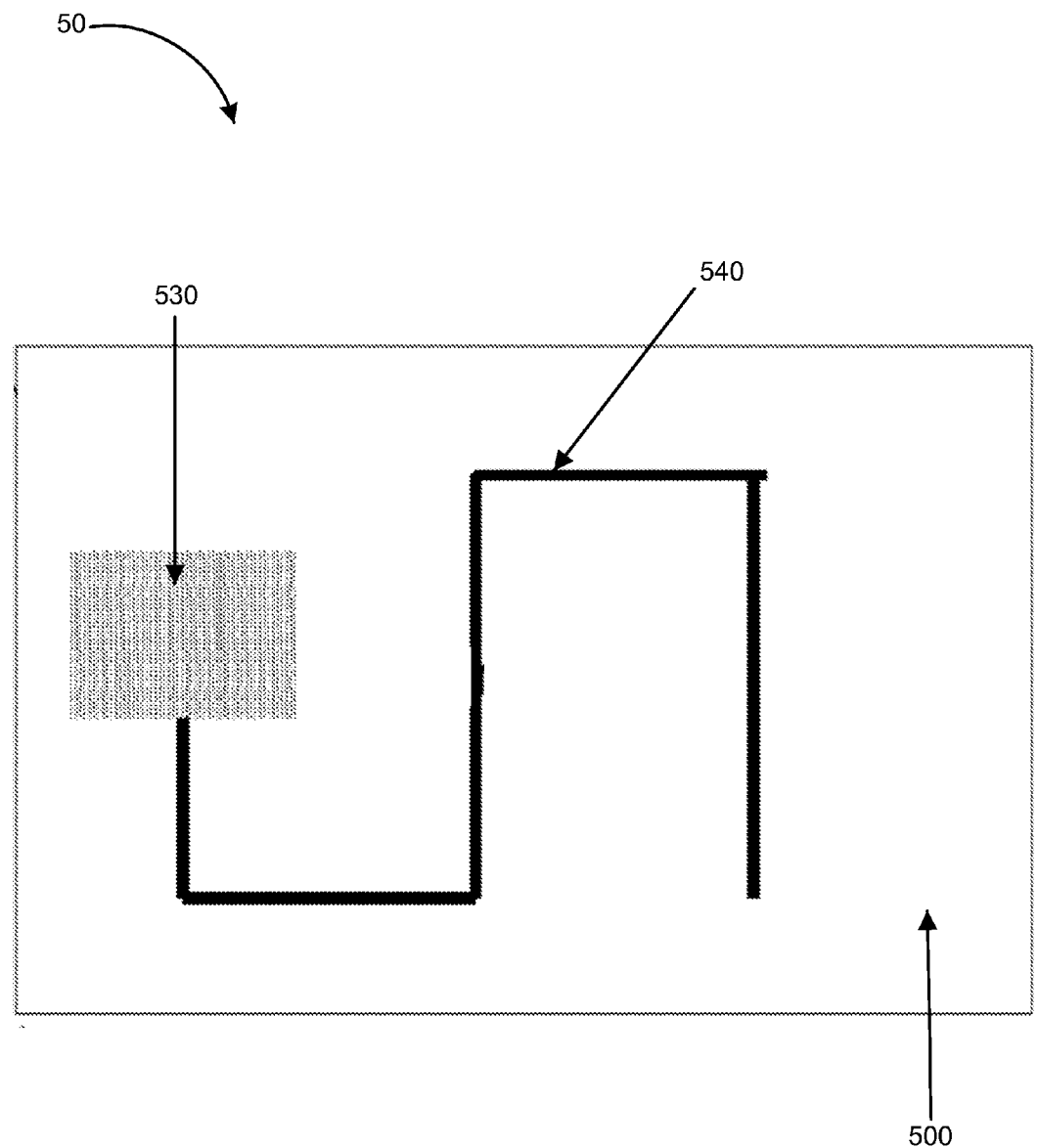
FIG. 5 illustrates a top view of the above device.

FIG. 5 illustrates a top view of the same device. The figure shows the relative configuration of the metal pad 530 connected to a mesh, labyrinthine or convoluted or serpentine or fingered top electrode 540, which conducts bias current in the top layer of the GaN LED layers 500.

It should be appreciated that GaN type LEDs are not the only kind of LED materials that can be employed in the present discussion, but that the present description is merely illustrative so that those skilled in the art can appreciate some preferred embodiments and methods for making and designing the present LEDs. Similarly, in the following preferred and exemplary illustrations, it is to be understood that many other similar and equivalent embodiments will be apparent to those skilled in the art and which accomplish substantially the same result. This is true as to variations in the geometry, layout, configurations, dimensions, and choice of materials and other aspects described in the present examples. Specifically, certain described elements and steps can be omitted, or others can be substituted or added to that which is described herein for the sake of illustration without materially affecting the scope of the present disclosure and inventions. Furthermore, the embodiments can also be used for additional electronic devices such as power transistors (power IC), RF components (RFIC) as well as Micro Electro Mechanical systems (MEMs).

Figure 6:
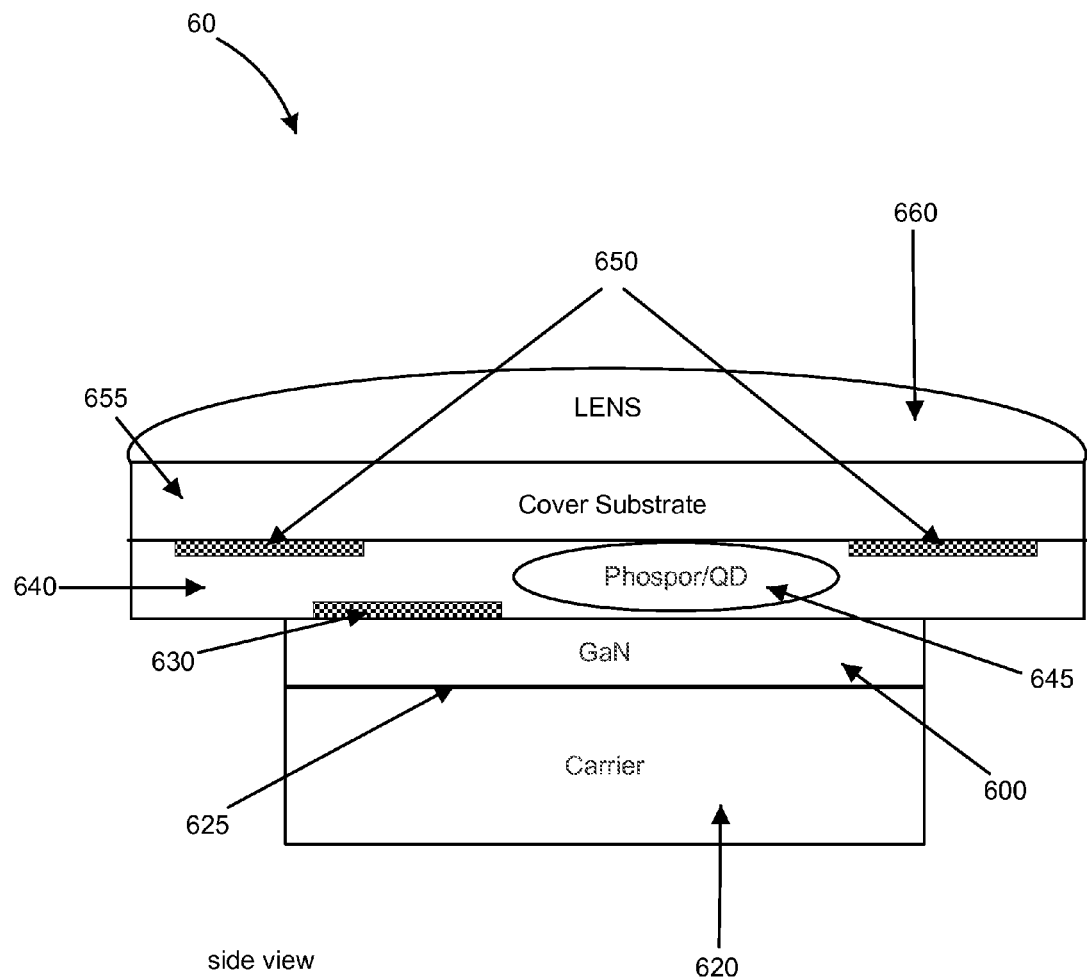
FIG. 6 illustrates a cross sectional view of an exemplary light emitting device.

FIG. 6 illustrates a cross sectional view of an exemplary light emitting device 60. The device 60 includes the GaN LED layer 600 separated from the carrier layer 620 by a metallic interface 625 as described above. Metal pad 630 is disposed on the LED layer 600.

An optically transparent or transmissive adhesive layer 640 is placed against the opposing side of the LED material 600 than the carrier 620 is (meaning, one face of the LED 600 is proximal to the carrier 620 and the other opposite face of the LED 600 is proximal to the transparent adhesive layer 640. The transparent or optically permissive adhesive layer 640 may be composed of silicone or some other suitable material that can provide adhesion or epoxy quality to bond or mechanically couple elements of light emitting device 60. In an additional embodiment, the adhesive layer may be photo definable. In case the Silicon Carbide wafer is kept, in an additional embodiment, the adhesive is index matched to the Silicon Carbide to reduce optical reflections at the interface. In other cases the adhesive layer refractive index, or composition, can be designed to minimize reflections from the GaN layers.

Within, or contiguous to transparent or optically permissive adhesive layer 640 is a region containing phosphor and/or quantum dot material (QD) 645. In operation, photons emitted from LED layer 600 travel through said optically transparent adhesive layer 640 and the region containing the phosphor and/or quantum dots 645. This causes color (wavelength) control and emission of selective desired light out of the LED device as further described herein.

One, two or more alignment marks 650 are provided on or in the transparent adhesive layer 630 and are used to align the LED body over a cover substrate 655 sheet and generally in an extended wafer structure during manufacture. The cover substrate 655 provides structural presence and mechanical coupling for elements of the LED device 60. The cover substrate 655 is also transparent or optically permissive to light in the wavelength emitted by LED layer 600 and Phosphor layer.

In some embodiments, an optical lens 660 may be placed on the cover substrate 655 substantially above the body of the LED emitting portions of the device 60. The lens 660 can act to spread, diffuse, collimate, or otherwise redirect and form the output of the LED.

Figure 7:
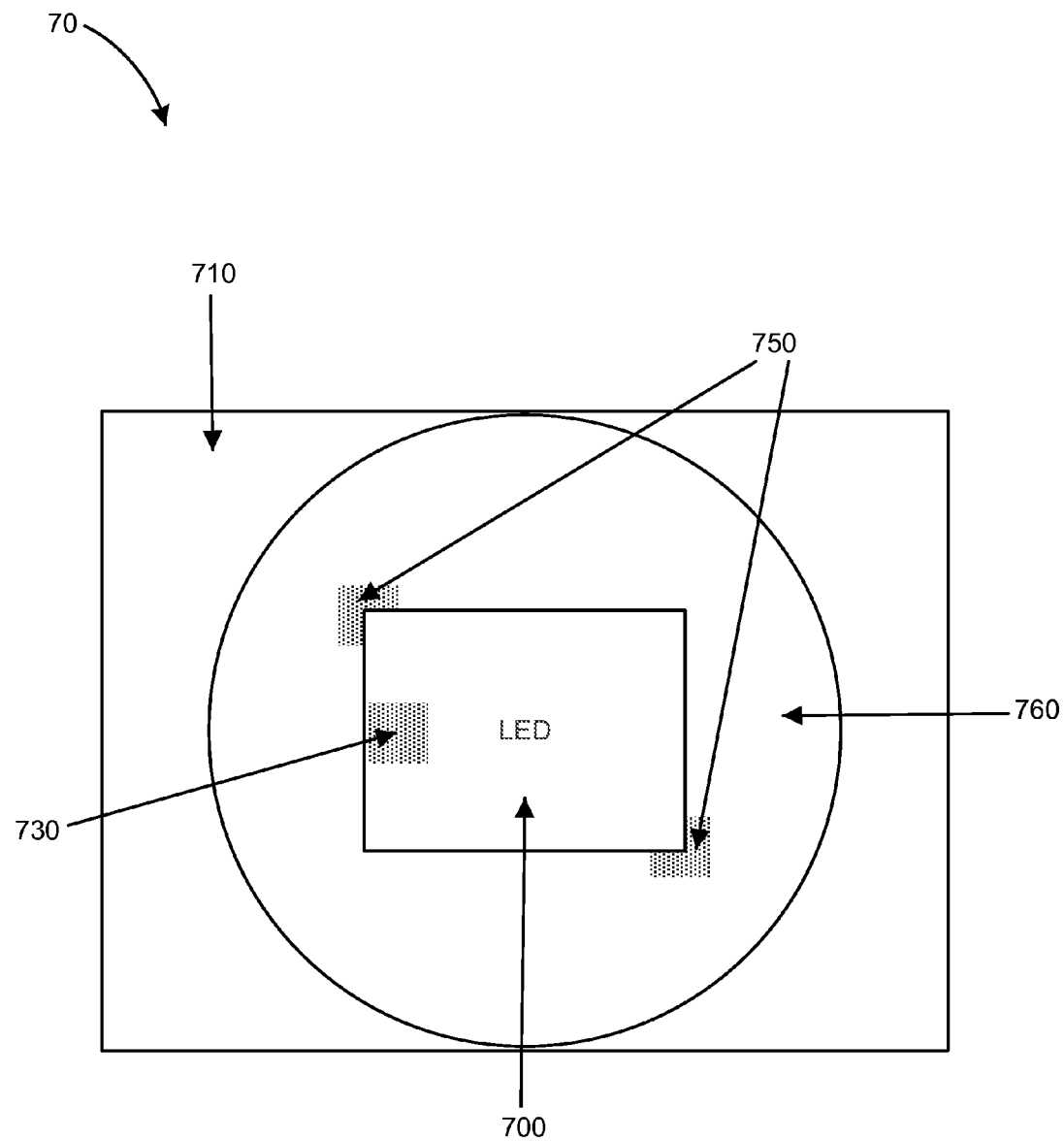
FIG. 7 illustrates an LED device in a top view thereof.

FIG. 7 illustrates an LED device 70 in a top view thereof. The device includes substantially the elements described above with regard to FIG. 6, including an LED emitting body 700 and positioning or alignment markers 750, lens 760, arranged on a patterned cover substrate 710, and including metal pad 730 thereon. In an embodiment, the LED is positioned with respect to said alignment marks 750. Between adjacent LEDs on a wafer there is a space of, e.g., 50 microns for subsequent processing and dicing of the LEDs.

The LEDs are individually assembled on a carrier wafer, with the GaN layers facing the carrier wafer. In case of Silicon Carbide, the Silicon Carbide would be facing the carrier. The carrier wafer layer is of optically transparent material such as glass or plastic as described above. The cover can include other optical components such as lenses or light diffusing structures or light guiding structures. As mentioned, the phosphor or quantum dot layers enable the conversion of the light generated by the LED to other colors. The most common is the use of phosphor to enable White light from a blue LED. In one embodiment the lens shape is created by the surface tension of a drop of polymer or silicone material. In another embodiment the lens is created by hot embossing of a polymer, which is applied to one side of the carrier wafer. The carrier wafer may be further patterned to create specific drop shapes, sizes and desired surface qualities.

The system may be coupled to other optical elements as would be appreciated by those skilled in the art. One or more optical lens or assembly of optical lenses, Fresnel layers, filters, polarizing elements, or other members can be used to further affect the quality of the light provided by the LED device.

Figure 8:
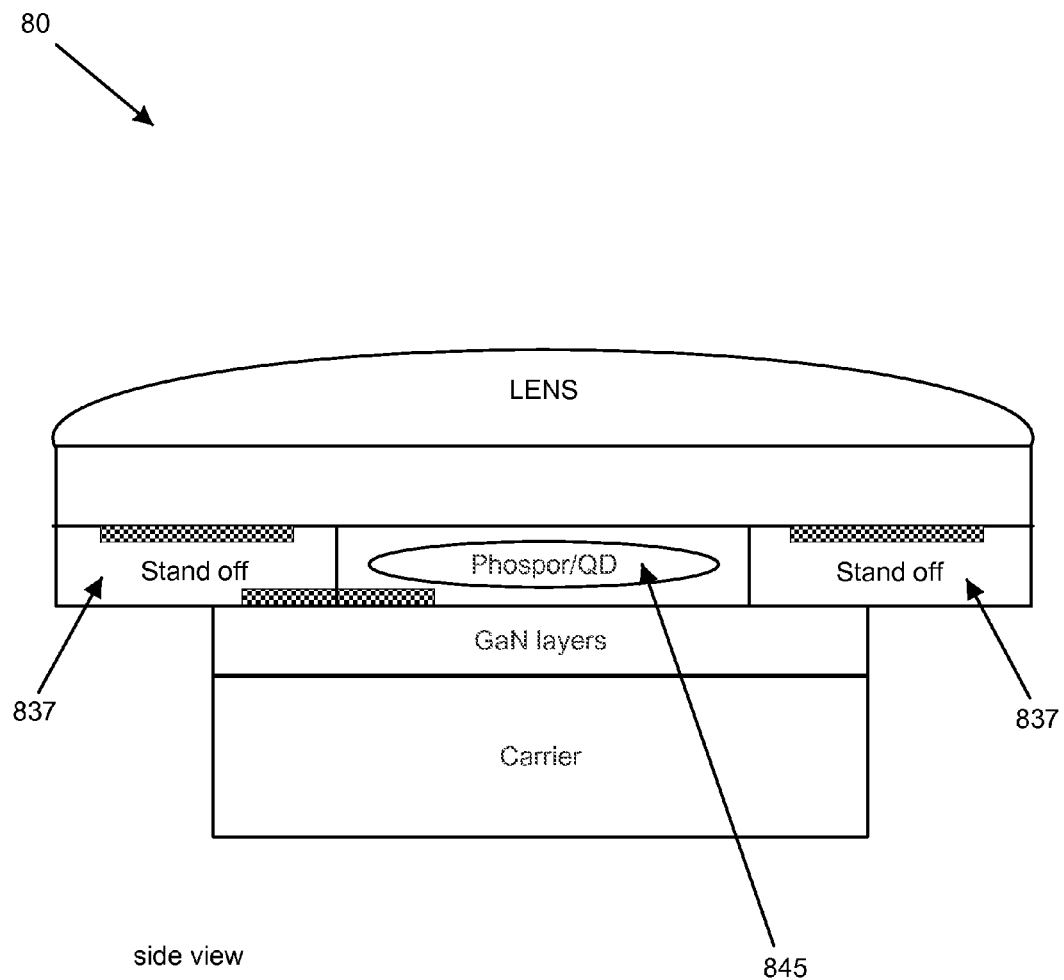
FIG. 8 illustrates another exemplary cross sectional view of a LED device.

FIG. 8 illustrates another exemplary cross sectional view of a LED device 80. Standoff structures 837, made of a suitable mechanically supportive material are created on the carrier wafer. The standoff structures 837 can comprise a thermoplastic material and created by embossing or injection molding, or the structures can be made by applying a layer of photo definable material such as polymide or solder mask and exposing the material to light using a suitable mask. The standoff structures 837 can be used to encase the QD or phosphor material 845, or alternatively to provide a cavity for the material deposition.

Figure 9:
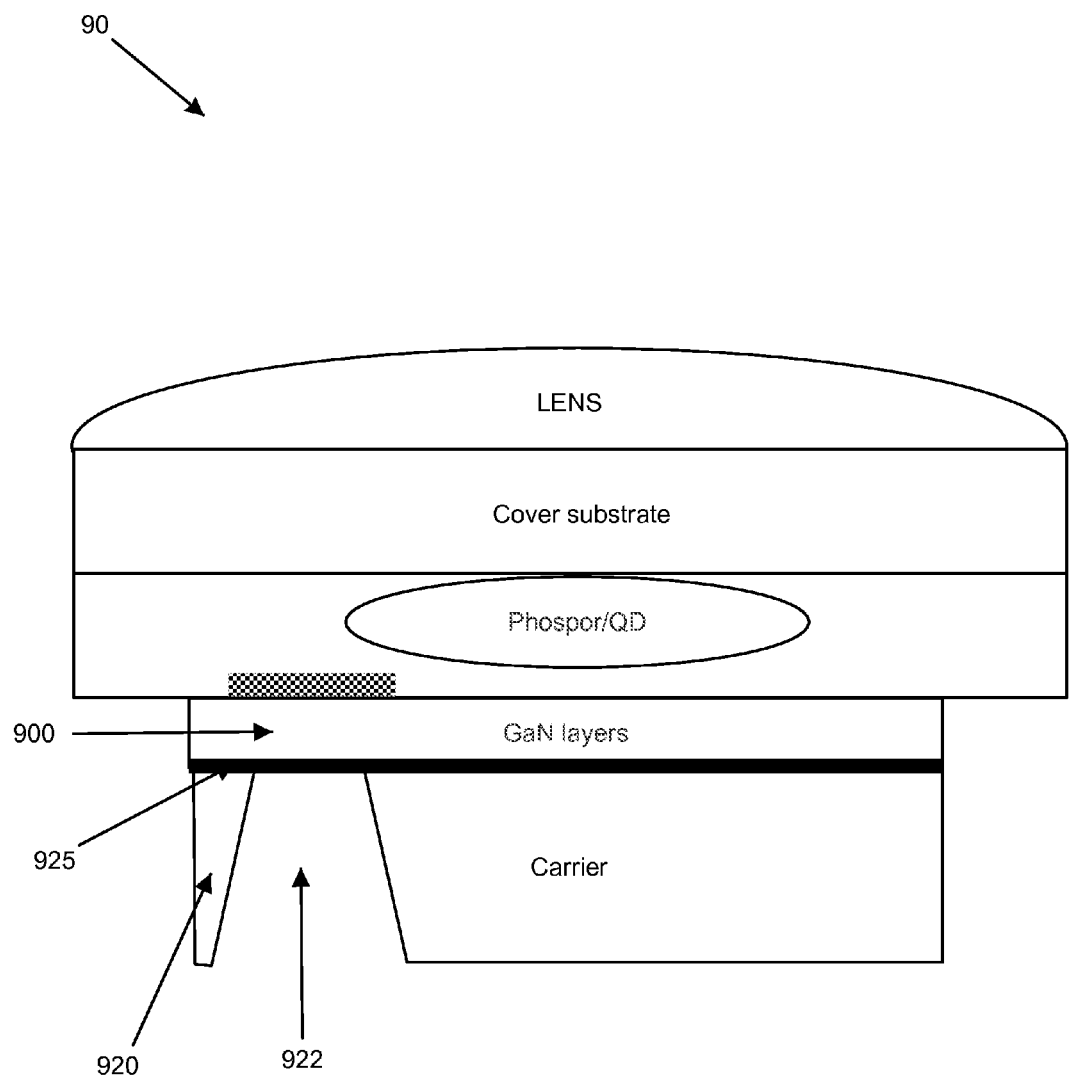
FIG. 9 illustrates a light emitting device similar to those described above except that a recess is etched into the carrier layer.

FIG. 9 illustrates a light emitting device 90 similar to those described above except that a recess is etched into the carrier layer 920 exposing the metallic interface 925 separating the carrier layer 920 from the GaN LED layers 900. The recess 922 can form the basis for electrical contact points for the device.

Figure 10:
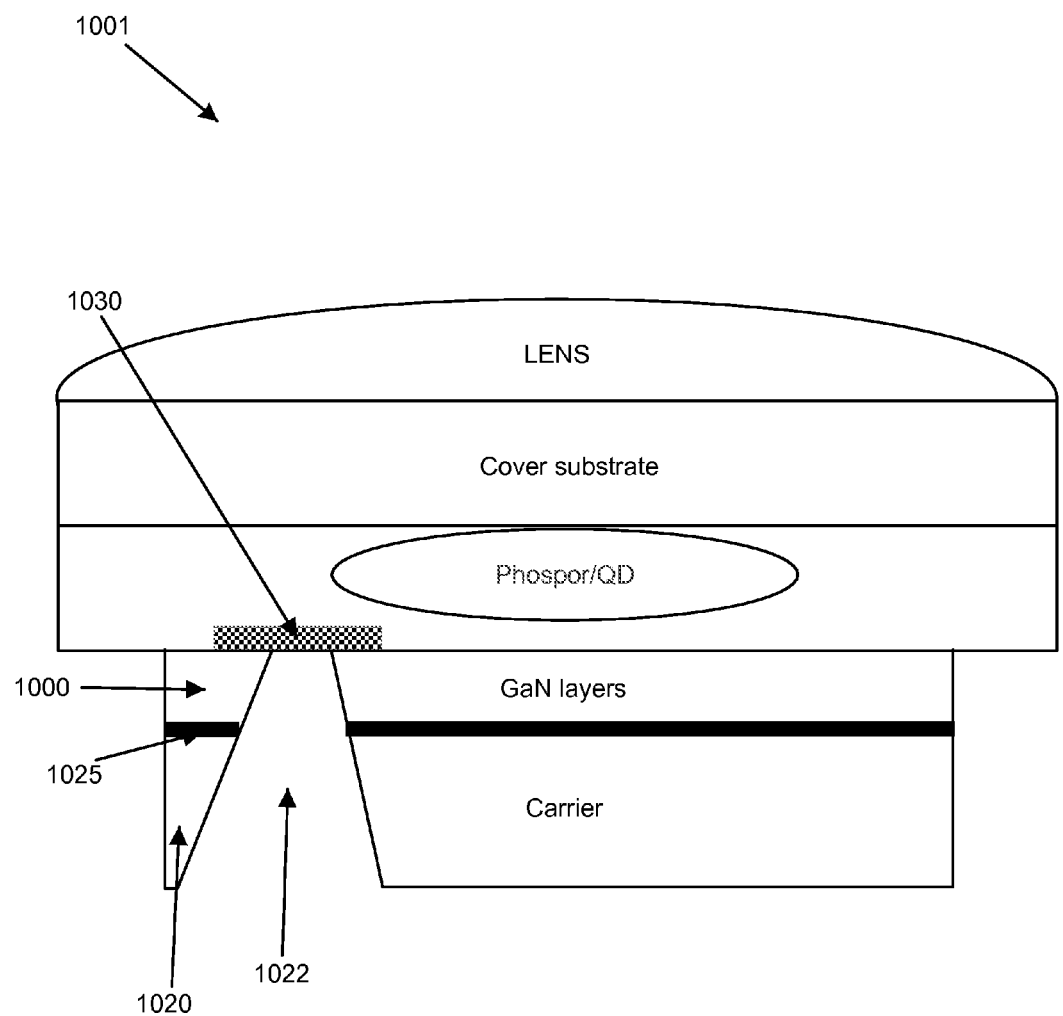
FIG. 10 illustrates yet another exemplary light emitting device cross section.

FIG. 10 illustrates yet another exemplary light emitting device 1001 cross section. Here, the recess 1022 has been etched or created deeper into the device so that it extends through the carrier layer 1020 and the metallic interface 1025 and also into GaN layer 1000 all the way to reach the metal pad 1030. Electrical contact with the exposed components is possible, or the assembly can be further filled with suitable materials as described below.

Figure 11:
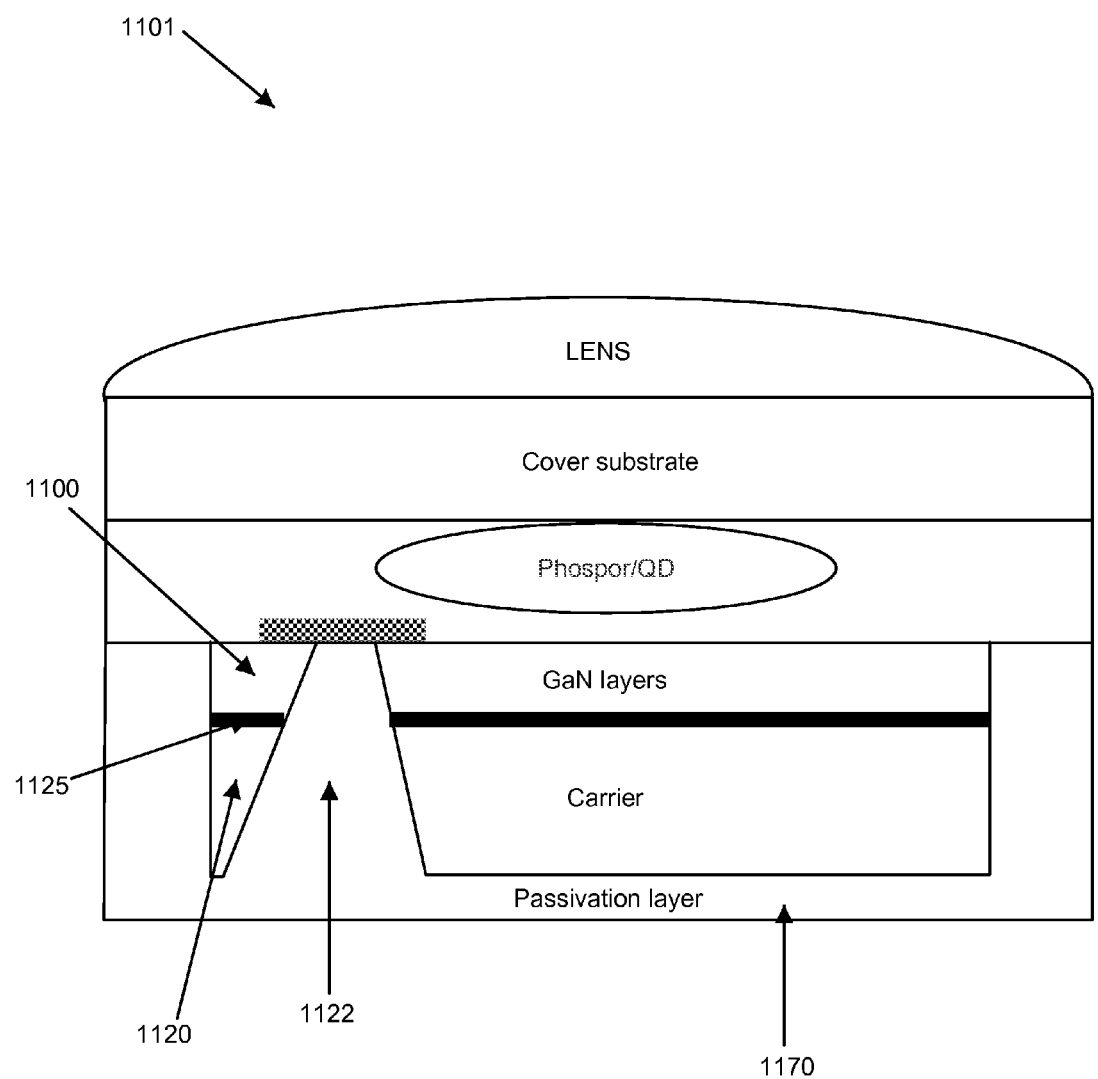
FIG. 11 illustrates an exemplary light emitting device similar to the last described devices including a passivation layer.

FIG. 11 illustrates an exemplary light emitting device 1101 similar to the last described devices including a passivation layer 1170 that has been applied to surround certain portions of the device around LED semiconducting layer 1100, metallic interface 1125, and carrier layer 1120. The passivation material 1170 fills the cavity or recess 1122 described earlier. The passivation layer 1170 can comprise a non conductive layer and can be composed of SiO2, SiN, AlN, Al2O3 or an organic material such as epoxy, or electrophoretic deposited paint as used in the car industry, or spray coated. In one embodiment, the passivation layer 1170 has a thickness that ranges from 1 to 40 microns, depending on the material and required electrical passivation level. In an embodiment, the passivation layer 1170 covers in a conformal manner the space between LEDs during manufacture. In another embodiment the spacing between the LEDs is not covered, or alternatively is revealed in a mechanical process such as dicing. The other elements of LED device 1101 are similar to similar elements described above.

In an additional embodiment the passivation layer can be designed to be reflective by incorporating appropriate material particles within such as ZnO. The passivation layer is also removed to enhance the heat conduction of the LED. Hence to optimize the heat conductance, a maximal contact should be made between the metal and metal pads on the LED and the metal layer. This is done by opening the largest possible area on the passivation layer and preferably greater than 80%. If the LED is designed with a thermal pad structure then the P connection can be connected to thermal and P pad or alternatively three metal connections are facilitated, N, P and thermal.

In another embodiment, the passivation is also removed in areas where there is no metal layer, only the electrically insulating layer. This can occur, if instead of the LED described previously, a standard LED is used in which the metal covers only a small portion of the top of the LED. In this case the metal layer deposited in this stage will provide the heat removal and light reflection. In this manner, the exposed portions of the LED will extend beyond the metal areas. The newly deposited metal will again cover substantially all of the LED structure. In another embodiment, if the electrical passivation layer is optically reflecting and heat conducting the layer may be maintained and the metal passivation will cover substantially all the LED area but will make a direct connection to the LED metal pads, and in other areas the connection layers would be through the passivation layer, i.e. the layer stack would be, LED, LED passivation layer, packaging passivation layer which provides low thermal resistance and light reflection, packaging metal for heat conduction.

Figure 12:
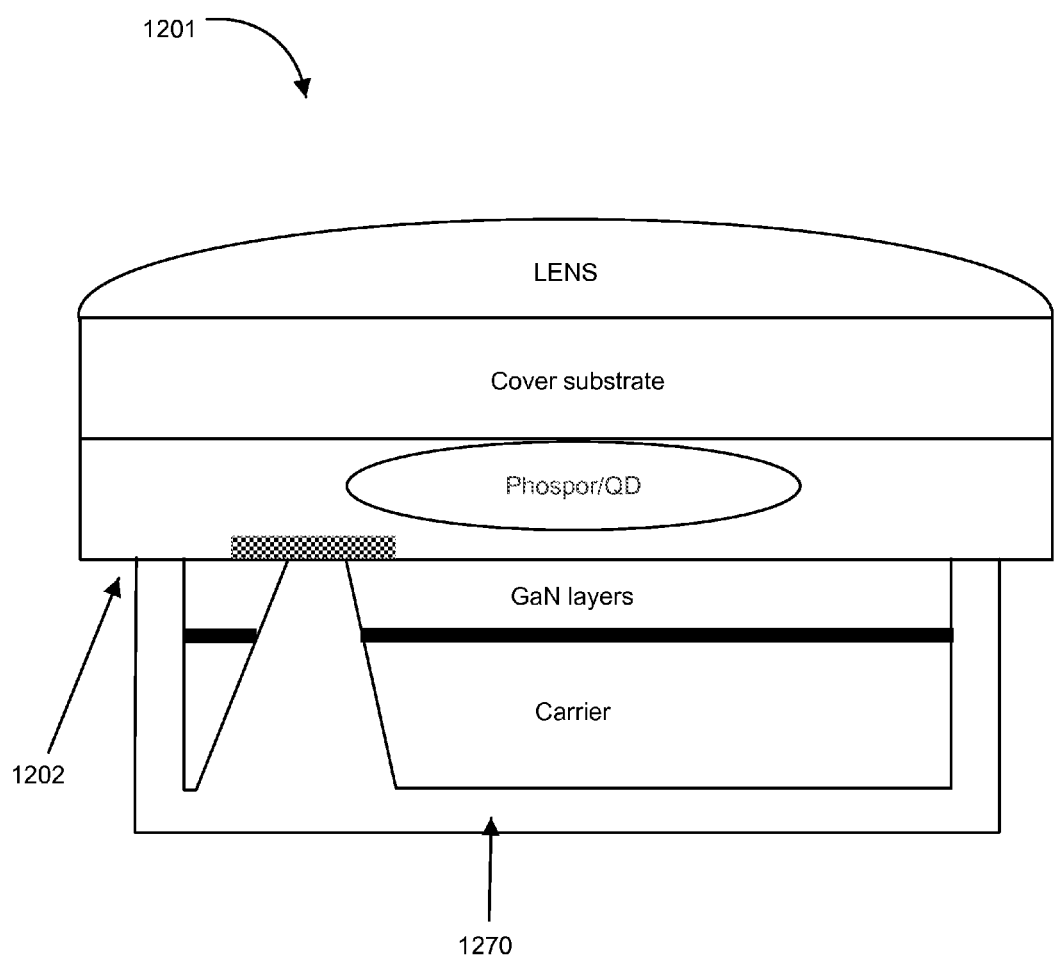
FIG. 12 shows a similar device to those described above, with its passivation layer being cut.
Figure 13:
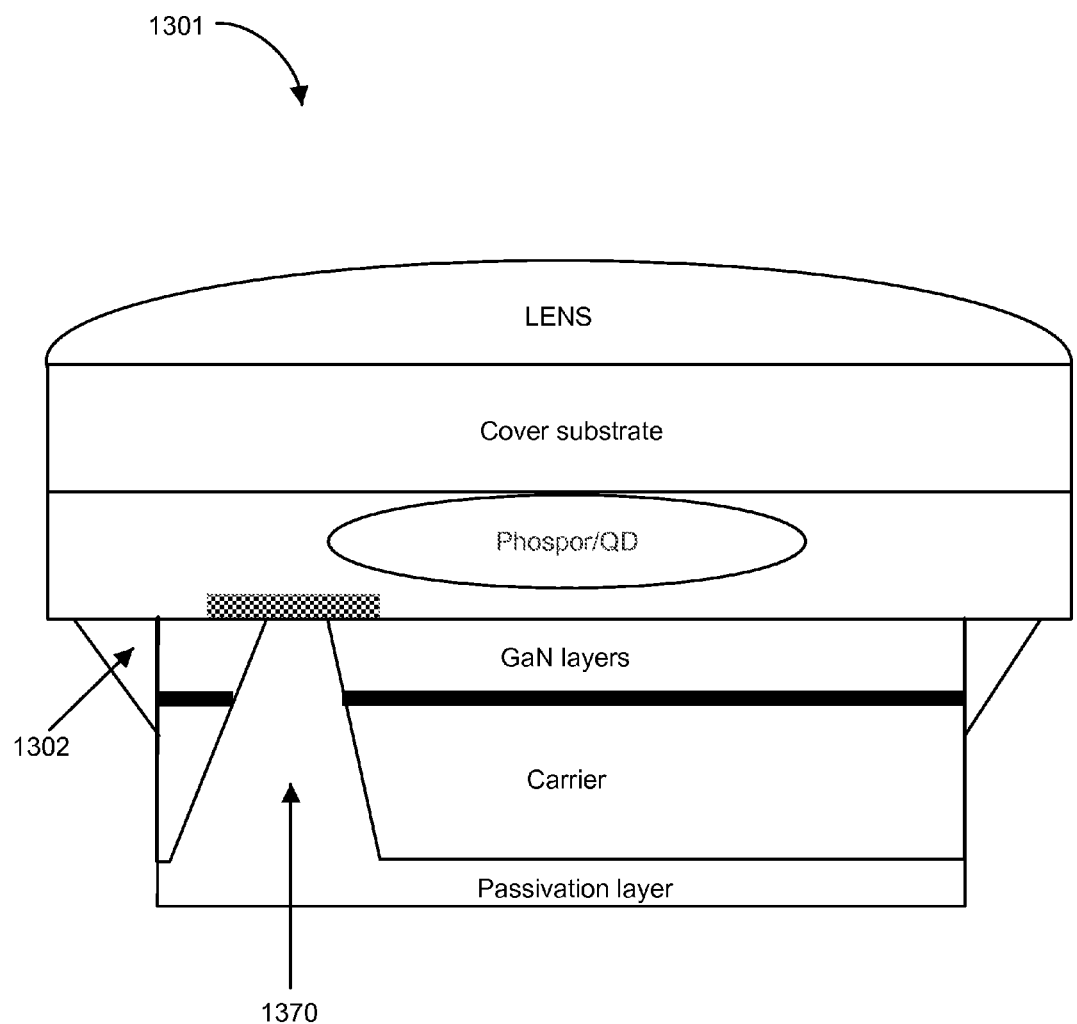
FIG. 13 illustrates a shaped edge of the above passivation layer in a light emitting device.

FIG. 12 shows a similar device 1201 to those described above, except the passivation layer 1270 has been cut and dimensioned to expose a shoulder 1202 in the device, which can be shaped in a beveled or contoured or angled way as shown in FIG. 13 to provide a mirrored surface 1302 for reflecting light out of the light emitting device 1301. The passivation layer 1370 or shoulders 1302 can be patterned in a manner to provide for example optical reflectivity by angling or shaping the edges of passivation layer 1370 or shoulders 1302.

Figure 14:
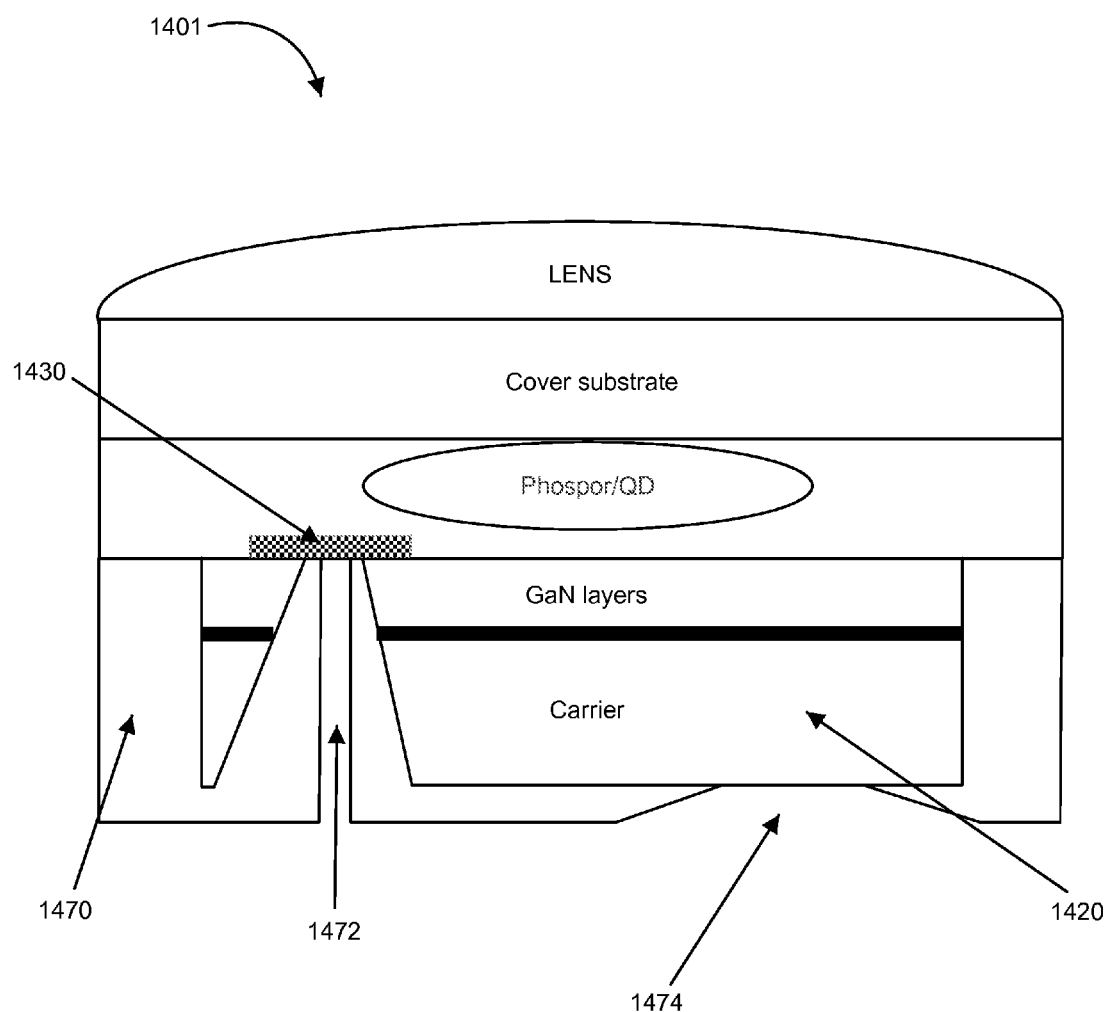
FIG. 14 illustrates another exemplary light emitting LED device.

FIG. 14 illustrates another exemplary light emitting LED device 1401. Similarly numbered elements discussed earlier are common to or similar to those in this exemplary embodiment. Here, contact holes 1472, 1474 are drilled or etched into passivation layer material 1470, in one embodiment by use of a laser. This exposes a first contact 1472 at metal pad 1430 and a second contact 1474 at carrier 1420. If SiN or SiO2 are used, a plasma etch can also be used to create the contact holes. If the passivation layer is photo definable, a lithography step can expose the pads. In another embodiment the organic passivation layer is etched using a hard mask made of inorganic material such as a thin metal or insulating layer and then using plasma etch to remove the organic material.

Figure 15:
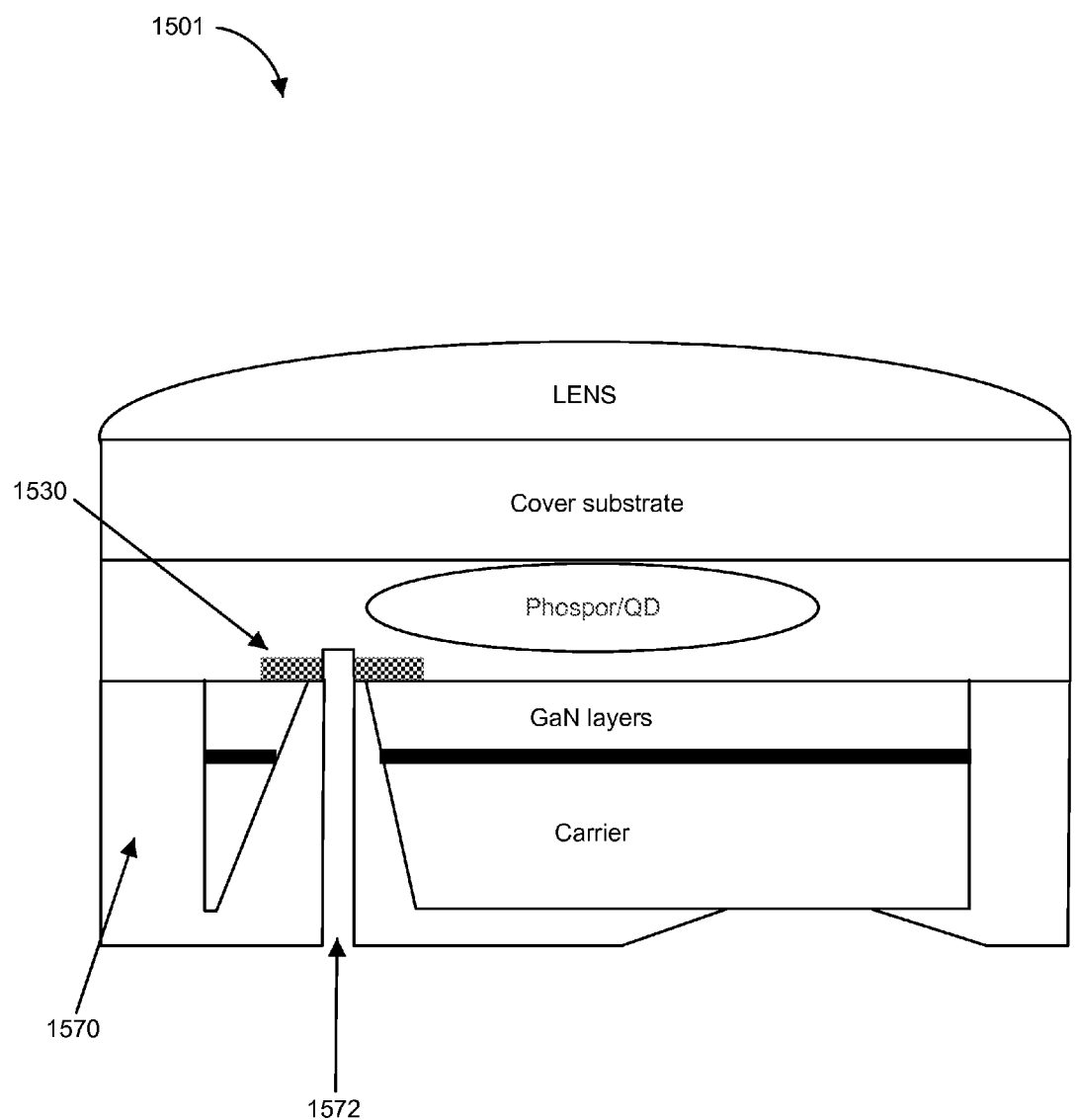
FIG. 15 illustrates yet another exemplary light emitting device.

If a laser is used to drill through the passivation layers 1570 as shown in FIG. 15, the laser drilling can either stop at the metal pad (blind via) as above, or it can continue so as to cut through the metal pad 1530 as shown in FIG. 15 to make electrical contact therewith.

It is noted that passivation layer 1570 is cut or etched away as stated above so as to provide conducting access at least to the N-type semiconductor proximal to laser drilled recess 1572 and the P-type semiconductor proximal to the metallization layer as described earlier.

Figure 16:
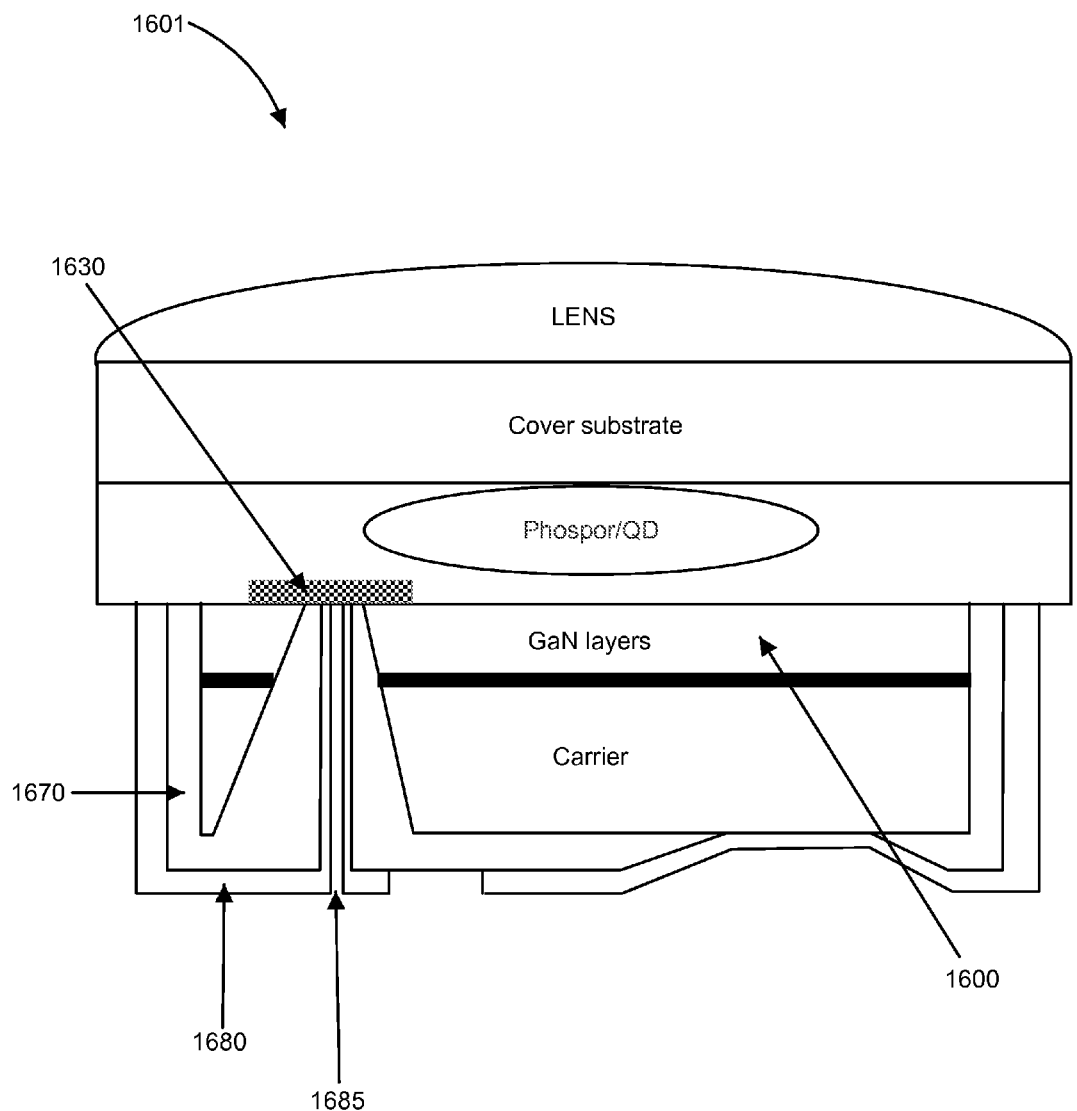
FIG. 16 illustrates still another embodiment of a light emitting device.

FIG. 16 illustrates yet another embodiment of a light emitting LED device 1601. Here, a metal seed layer 1680 is applied over the passivation layer 1670. The metal seed layer 1680 may be composed of any of titanium, chrome, nickel, palladium, platinum, copper or combinations of these. The seed layer can be thickened using sputtering over the initial seed layer. In one embodiment the seed layer 1680 is patterned using electrophoretic deposited photo resist, spray coating resist, or thick resist, in one embodiment greater than 50 microns. The resist is patterned to create the electrical routing connections and under bump metallization (UBM).

After patterning the resist, a thick metal layer, in one preferred embodiment between 10 and 40 microns is plated in the defined patterns. The resist is removed and the bare seed layer is etched, in one non-limiting embodiment by using a wet metal etch. In one embodiment a solder mask is applied to form such a layer. In operation, the layer 1680 provides enhanced electrical conductivity between external electrical components and the metallization layer or conducting pads of the device. This layer 1680 also provides maximum enhanced heat removal from LED layer 1600. A drilled aperture 1685 may be provided to allow electrical contact with metal pad 1630, or may be filled in with some conducting or non-conducting material after formation.

Figure 17:
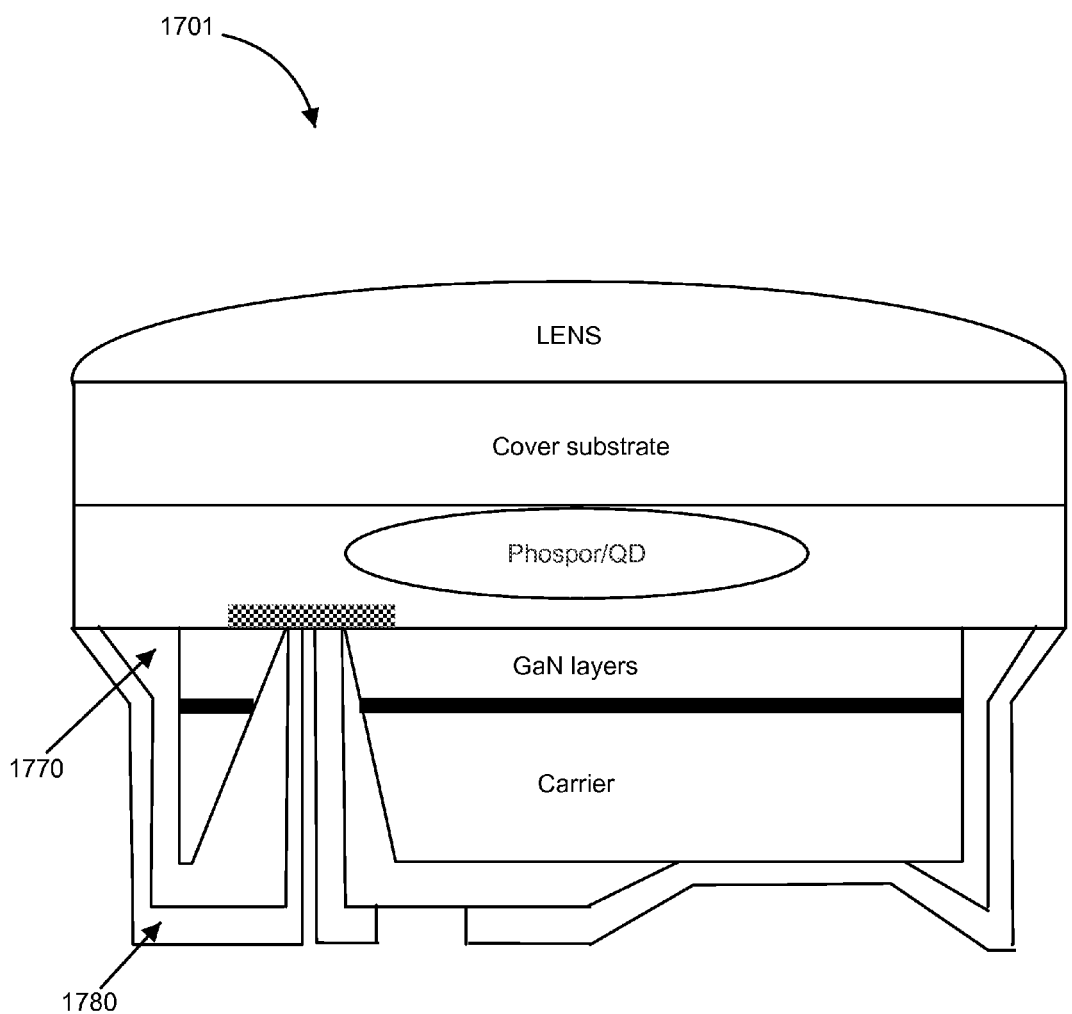
FIG. 17 illustrates an exemplary light emitting LED device.

FIG. 17 illustrates an exemplary light emitting LED device 1701 where the edges of the passivation layer 1770 and the metallizing layer 1780 have been beveled, cut, formed, cast, shaped or otherwise contoured at the edges thereof to form a configuration that is suitable for reflecting light upwards and out of the device. In some embodiments the metallization layer 1780 acts like silvering of a face of a mirror to achieve the above result.

Figure 18:
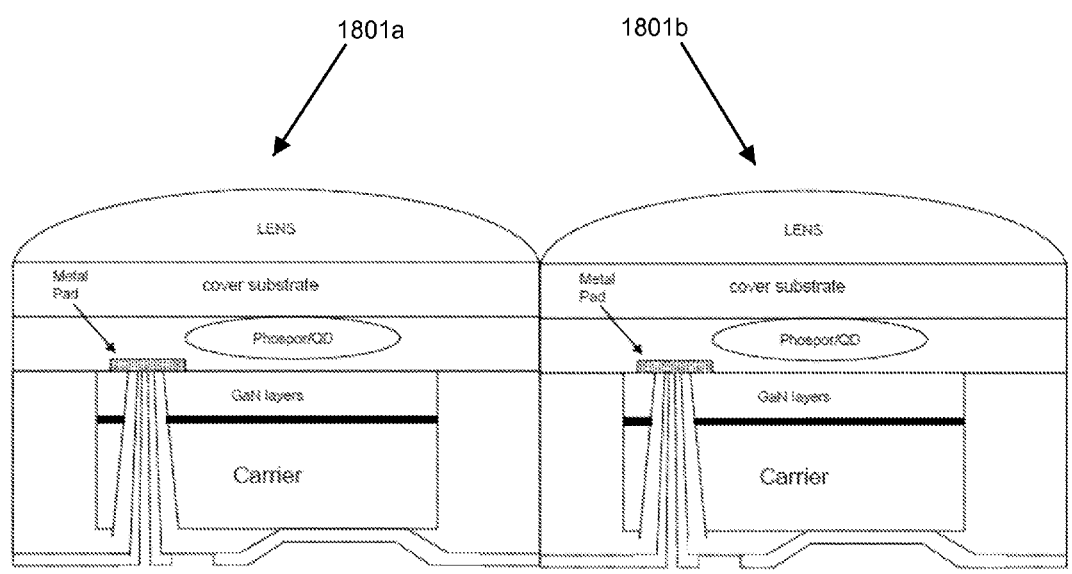
FIG. 18 illustrates how more than one LED device like those described above can be manufactured on a single manufacturing platform or wafer.

FIG. 18 illustrates how more than one LED device like those described above can be manufactured on a single manufacturing platform or wafer. Here, two LED units 1801a and 1801b are electrically connected in the metallization step of manufacturing the units. The LEDs can be connected in parallel, serial or combinations of such connections. These can be cut apart or in other embodiments can be left arranged on the substrate without cutting so as to form a multi LED unit or light source.

The present invention should not be considered limited to the particular embodiments described above, but rather should be understood to cover all aspects of the invention as fairly set out in the present claims. Various modifications, equivalent processes, as well as numerous structures to which the present invention may be applicable, will be readily apparent to those skilled in the art to which the present invention is directed upon review of the present disclosure. The claims are intended to cover such modifications.

What is claimed is:

1. A light emitting device, comprising:
    a semiconductor LED including doped and intrinsic regions thereof;
    a conducting support layer disposed proximal to a first surface of said semiconductor LED and separated therefrom by a metallic interface with no additional intervening layers, said conducting support layer is no more than 50 microns in thickness;
    an optically permissive layer proximal to a second surface of said semiconductor LED, said first and second surfaces of said semiconductor LED being on opposing faces thereof;
    an optically definable material proximal to or within said optically permissive layer that affects an optical characteristic of emitted light passing therethrough;
    an optically permissive flat cover substrate covering at least a portion of the above components; and
    a metal pad between said semiconductor LED and said optically permissive layer,
    wherein, said first surface of said semiconductor LED, said metallic interface and said conducting support layer are all electrically coupled to one another.

2. The light emitting device of claim 1, further comprising a lens covering at least a portion of said optically permissive flat cover substrate.

3. The light emitting device of claim 1, further comprising a passivation layer disposed on said conducting support layer, said passivation layer being substantially non-conductive yet provided with at least a pair of apertures for connection of conducting electrodes thereto.

4. The light emitting device of claim 3, said passivation layer further comprising a shaped edge configured to reflect light generated by said light emitting device outwardly therefrom.

5. The light emitting device of claim 1, further comprising a mechanical offsetting member providing a dimensional spacing between said optically permissive layer and said semiconductor LED layer.

6. The light emitting device of claim 1, further comprising at least one alignment mark indicative of a required position of said device with respect to said optically permissive flat cover substrate.

7. The light emitting device of claim 1, wherein the metallic interface is adjacent to both the conducting support layer and the semiconductor LED.

8. The light emitting device of claim 1, said conducting support layer comprises copper.

9. A method for making a light emitting device, the method comprising:
    growing a plurality of doped layers in a light emitting device (LED) on a substrate;
    depositing a metallic interface onto said LED opposite to said substrate;

electroplating a conductive support layer onto said metallic interface;

lifting off said substrate from said LED;

forming a metal pad on the newly exposed LED surface;

etching a recess through said conductive support layer, said metallic interface and said LED so as to allow electrical contact with said metal pad and consequently a first doped layer of said LED;

providing electrical contact to said conductive support layer and consequently to a second doped layer of said LED so as to bias the LED using a bias voltage applied between said first and second doped layers of the LED; and securing the LED to an optically permissive cover substrate using an optically permissive layer including an optically definable material through which light generated by said LED can pass.

10. The method of claim 9, further comprising applying an electrically isolating passivation layer to said conductive support layer, and further providing at least a pair of apertures in said passivation layer for electrical coupling of a corresponding pair of biasing electrodes with corresponding first and second doped layers of said LED.

11. The method of claim 10, further comprising placing one or more alignment marks on said LED so as to permit proper positioning of said LED with respect to said optically permissive cover substrate.

* * * * *